United States Patent
Carroll et al.

(10) Patent No.: US 6,552,892 B2
(45) Date of Patent: Apr. 22, 2003

(54) METHOD AND APPARATUS FOR THE GROUNDING OF PROCESS WAFERS BY THE USE OF CONDUCTIVE REGIONS CREATED BY ION IMPLANTATION INTO THE SURFACE OF AN ELECTROSTATIC CLAMP

(75) Inventors: James C. Carroll, Amesbury, MA (US); Dennis M. Klesel, Sandown, NH (US); Bryan C. Lagos, Danvers, MA (US); Klaus Petry, Merrimac, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 147 days.

(21) Appl. No.: 09/852,221

(22) Filed: May 9, 2001

(65) Prior Publication Data

US 2002/0167779 A1 Nov. 14, 2002

(51) Int. Cl.[7] .................................... H01T 23/00
(52) U.S. Cl. ............................................ 361/234
(58) Field of Search ............................. 361/230–235; 279/128

(56) References Cited

U.S. PATENT DOCUMENTS

| 6,023,405 A | 2/2000 | Shamouilian et al. |
|---|---|---|
| 6,072,685 A | 6/2000 | Herchen |
| 6,073,681 A | 6/2000 | Getchel et al. |
| 6,104,595 A | 8/2000 | Brown |
| 6,108,189 A | 8/2000 | Weldon et al. |
| 6,117,246 A | 9/2000 | Parkhe et al. |
| 6,134,096 A | 10/2000 | Yamada et al. |
| 6,388,861 B1 * | 5/2002 | Frutiger ...................... 361/234 |
| 6,414,834 B1 * | 7/2002 | Weldon et al. .............. 361/234 |

* cited by examiner

Primary Examiner—Matthew Nguyen
(74) Attorney, Agent, or Firm—Eschweiler & Associates, LLC

(57) ABSTRACT

The present invention relates to an electrostatic clamp and comprises a dielectric layer overlying an electrode and a doped region in the dielectric layer. The doped region of the dielectric layer is electrically conductive, and when the doped region is coupled to a circuit ground potential, the doped region of the dielectric layer is operable to bleed off charge which accumulates on a workpiece residing thereon during processing. The present invention further comprises a method of forming an electrostatic clamp which comprises the steps of forming an electrically insulating layer over an electrode and doping a portion of the electrically insulating layer, wherein the doped portion of the electrically insulating layer becomes electrically conductive.

22 Claims, 8 Drawing Sheets

METHOD AND APPARATUS FOR THE GROUNDING OF PROCESS WAFERS BY THE USE OF CONDUCTIVE REGIONS CREATED BY ION IMPLANTATION INTO THE SURFACE OF AN ELECTROSTATIC CLAMP

FIELD OF THE INVENTION

The present invention relates generally to ion implantation systems, and more specifically to an electrostatic clamp having a discharge path associated with a dielectric layer thereof for bleeding off charge which may accumulate during workpiece processing.

BACKGROUND OF THE INVENTION

Ion implanters are used to implant or "dope" silicon wafers with impurities to produce n or p type extrinsic materials. The n and p type extrinsic materials are utilized in the production of semiconductor integrated circuits. As its name implies, the ion implanter dopes the silicon wafers with a selected ion species to produce the desired extrinsic material. Implanting ions generated from source materials such as antimony, arsenic or phosphorus results in n type extrinsic material wafers. If p type extrinsic material wafers are desired, ions generated with source materials such as boron, gallium or indium will be implanted.

The ion implanter includes an ion source for generating positively charged ions from ionizable source materials. The generated ions are formed into a beam and accelerated along a predetermined beam path to an implantation station. The ion implanter includes beam forming and shaping structure extending between the ion source and the implantation station. The beam forming and shaping structure maintains the ion beam and bounds an elongated interior cavity or region through which the beam passes en route to the implantation station. When operating the implanter, the interior region must be evacuated to reduce the probability of ions being deflected from the predetermined beam path as a result of collisions with air molecules.

For some types of ion implanters, the wafer or workpiece at the implantation station is mounted on a surface or support pedestal. For serial type implantation systems, a rotating support is not used and therefore a mechanism is typically employed to secure the workpiece on the support pedestal. One type of securement mechanism is an electrostatic chuck or clamp. While electrostatic chucks or clamps may vary in design, they are based primarily on the principle of applying a voltage to one or more electrodes embedded in the chuck so as to induce opposite polarity changes in the workpiece and electrode(s), respectively. The electrostatic attractive force between the opposite charges pulls the workpiece against the chuck, thereby retaining the workpiece in its position in a secure manner.

A typical electrostatic chuck or clamp includes an electrode covered by an insulator or dielectric layer. When the electrode of the chuck or clamp is electrically biased with respect to the substrate or workpiece by a voltage, an attractive electrostatic force is generated that holds the substrate or workpiece to the chuck. In monopolar electrode type chucks, an electrically charged plasma above the substrate induces electrostatic charge in the substrate that electrostatically holds the substrate to the chuck. A bipolar electrode chuck comprises bipolar electrodes that are electrically biased relative to one another to provide the electrostatic attractive force.

Referring initially to prior art FIG. 1, a simplified electrostatic chuck or clamp 10 is illustrated, wherein the chuck includes a dielectric or insulating region 12 overlying an electrode 14. A workpiece 16, for example, a silicon wafer undergoing implantation, overlies the dielectric region or cover 12. In operation, a voltage potential 18 is applied across the wafer 16 via the electrode 14. Due to the presence of the dielectric layer 12 which exhibits a large electrical resistance, an accumulation of electrostatic charge in the wafer 16 and the electrode 14 results in a coulombic electrostatic force characterized by the equation:

$$F=(\tfrac{1}{2})\epsilon_o\epsilon_r A(V/t)^2,$$

wherein $\epsilon_o$ and $\epsilon_r$ are the dielectric constants associated with a vacuum and the dielectric layer 12, respectively, A is the area of the electrode, V is the voltage applied to the electrode 14 via the source 18, and t is the thickness of the dielectric layer 12.

Another type of electrostatic clamp or chuck (not shown) employs Johnsen-Rahbek electrostatic attraction forces, which are a function of charge accumulation across an interfacial contact resistance such as an air gap. In any event, regardless of the particular type of clamp or chuck employed within the system, electrostatic forces work to secure the wafer in position on the chuck without need of a mechanical or physical mechanism touching the workpiece. The lack of physical clamping advantageously reduces particulate frontside contamination which may potentially result when a mechanical clamp mechanism contacts a workpiece.

One problem associated with electrostatic chucks or clamps such as the chuck 10 of prior art FIG. 1 is caused by positive charge accumulation on the workpiece 16 during implantation. As stated above, since positively charged ions are typically employed to dope a workpiece, positive charge may accumulate thereon, for example, as illustrated in prior art FIG. 2, and designated at reference numeral 20. As the charge 20 accumulates, it naturally seeks a path to ground, and when such a path is identified, such a substantial charge accumulation may result in an arcing to ground in an uncontrolled manner, which undesirably may damage the workpiece 16. Therefore mechanisms have been developed to address the problem by attempting to discharge any accumulated charge in a controlled manner.

Prior art FIGS. 3–5 illustrate one conventional method of discharging accumulated charge from the implantation workpiece. Prior art FIG. 3 is a plan view of an implantation pedestal 30 having one or more grounded, conductive electrodes 32 formed on a surface 34 thereof. Prior art FIG. 4 is a cross sectional view of the pedestal of prior art FIG. 3, taken along dotted line 4—4. The conductive electrodes 32 are grounded and thus readily provide a discharge path for any charge which may accumulate on the workpiece during ion implantation, thereby preventing a substantial accumulation of charge on the workpiece and protecting the workpiece from damage associated with an uncontrolled discharge.

As illustrated in prior art FIG. 4, the conductive electrodes 32 are formed on the pedestal surface 34 and thus represent raised portions which impact the topography of the pedestal 34. More particularly, the raised conductive portions 32 negatively impact the planarity of the pedestal surface 34. A resultant condition is illustrated in prior art FIG. 5, wherein the wafer or workpiece 16 overlies the pedestal surface 34 and makes contact with the grounded, conductive electrodes 32. Note that due to the conductive portions 32 being raised, the wafer 16 does not make good thermal contact to the chuck surface 34. As is generally known in the art, ion implantation, particularly in serial batch type systems, causes a significant amount of workpiece heating. The poor thermal contact caused by the electrodes 32 may cause the workpiece to overheat during implantation, thereby causing thermal damage to the workpiece or negatively impacting the implantation characteristics.

In addition to the poor thermal contact caused by the conductive raised portions 32, the physical contact caused at the wafer/electrode interface may generate particulate contamination in the ion implantation chamber, which undesirably may result in defects. Therefore although the raised, grounded electrodes 32 of FIGS. 3–5 are an effective means of discharging positive charge that would otherwise accumulate on the workpiece during implantation, the prior art solution negatively impacts the effective conduction of heat away from the workpiece and may contribute to increased particulate contamination.

Therefore there is a need in the art for an apparatus and method of addressing charge accumulation on the wafer during ion implantation which overcomes the disadvantages associated with the prior art.

SUMMARY OF THE INVENTION

The present invention is directed to an electrostatic clamp having a dielectric layer and a conductive portion which is associated and generally coplanar therewith. The coplanarity of the conductive portion with the dielectric layer surface allows for a grounding thereof for bleeding accumulated charge off of a workpiece situated thereon during processing while concurrently maintaining thermal contact with the workpiece and avoiding substantially the generation of particulate contaminants.

According to one aspect of the present invention, an electrostatic clamp is disclosed in which a dielectric layer overlies an electrode. The dielectric layer has a doped region embedded in a top surface thereof opposite the electrode. The doped region is electrically conductive while the remaining portion of the dielectric layer is electrically insulative. The doped region, when coupled to a circuit ground or other discharge potential, provides a discharge path for charge that accumulates on a workpiece (that rests on the top surface of the dielectric layer) during processing, such as ion implantation. Consequently, surface charge which would otherwise accumulate on the workpiece and create a potential reliability issue due to uncontrolled discharge, is discharged during workpiece processing in a controlled manner.

According to another aspect of the present invention, the electrode which underlies the dielectric layer, when a predetermined electric potential is applied thereto, exerts an electrostatic coulombic force on the workpiece, thereby securing the workpiece to the top surface of the dielectric layer without additional contact to the workpiece necessary. The doped region occupies only a portion of the top surface of the dielectric layer, therefore providing adequate area for removal of charge from the workpiece without affecting or otherwise interfering substantially with the electrostatic clamping force exerted on the workpiece via the underlying electrode.

According to still another aspect of the present invention, the dielectric layer or electrically insulating layer comprises a polyimide material such as KAPTON. The doped region in the polyimide exhibits broken or otherwise altered chemical bonds or structure due to the implantation of dopant therein. The broken bonds are believed to increase delocalized π-electrons and enhance charge mobility due to chain cross-linking. In any event, the doped regions exhibit a substantial electrical conductivity, for example, about $3\times10^{-3}$ Ω-cm, compared to the undoped regions of the polyimide which may exhibit a resistivity of about $10^{13}$ Ω-cm.

According to yet another aspect of the present invention, the dielectric layer, for example, a plastic material, a ceramic material or a glass material, is selectively doped with a conductive material such as a metal at a top surface thereof to generate an electrically conductive doped region therein. The electrically conductive doped region or regions, when coupled to a circuit ground or other type discharge potential, for example, provides a discharge path for charge which accumulates on the workpiece during processing thereof.

The coplanarity of the doped region within the dielectric layer, whether conductive due to broken chemical bonds or by doping with a conductive material, enables good thermal contact between the workpiece and the dielectric layer, thereby facilitating effective thermal conduction of heat away form the workpiece during processing such as ion implantation, and maintaining the workpiece in a generally safe or otherwise acceptable temperature range. In addition, the coplanarity of the top surface of the electrostatic clamp reduces particulate contamination associated with some conventional type electrostatic clamps.

According to yet another aspect of the present invention, a method of forming an electrostatic clamp is disclosed. The method comprises forming an electrically insulating material or layer over a conductive electrode. The electrically insulating material is then selectively doped to form a doped region which is generally coplanar with a top surface thereof. The doped region is electrically conductive and when coupled to a circuit ground potential, for example, provides a controlled discharge path to remove charge which would otherwise accumulate on the workpiece undergoing processing.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
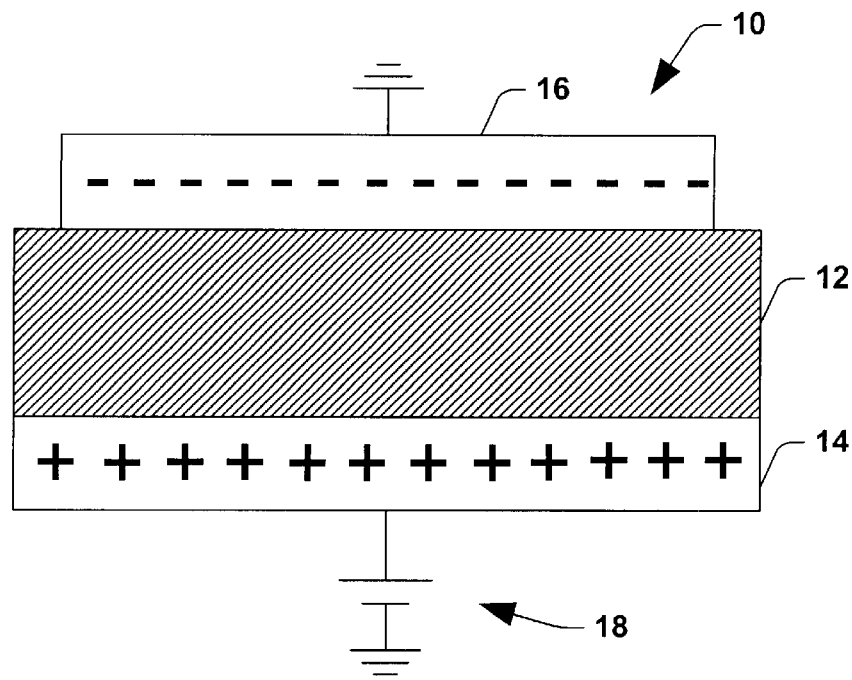
FIG. 1 is a prior art cross section diagram illustrating a conventional electrostatic clamp device.
Figure 2:
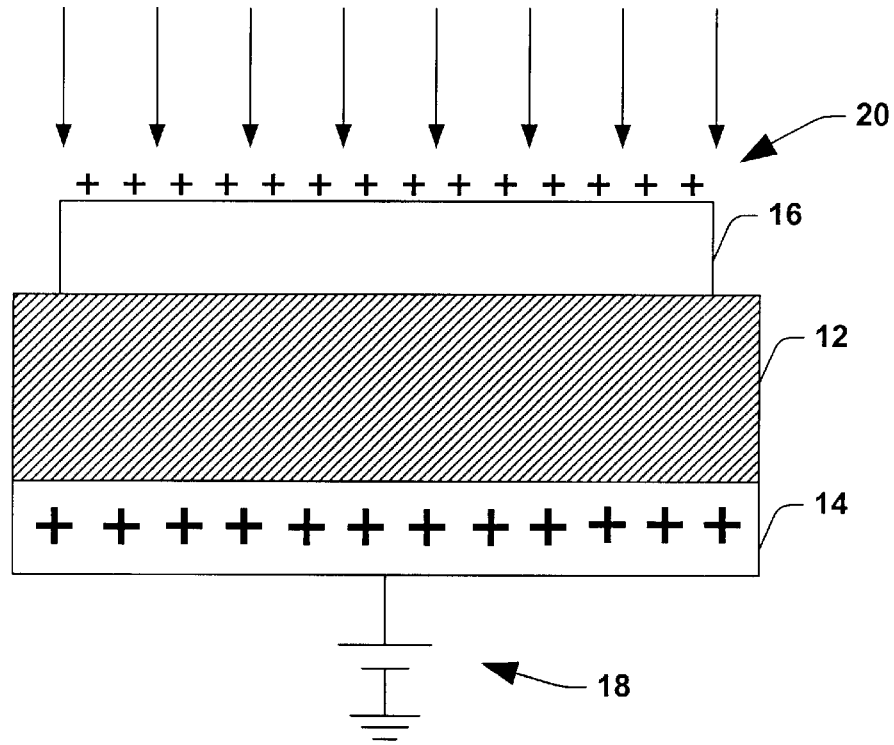
FIG. 2 is a prior art cross section diagram illustrating charge accumulation on a workpiece during processing thereof, wherein the workpiece is secured using an electrostatic clamp device.

The present invention will now be described with reference to the drawings wherein like reference numerals are used to refer to like elements throughout. The present invention includes a system and method of forming an electrostatic clamp device. The electrostatic clamp of the present invention incorporates a discharge path with a top dielectric clamp surface to bleed off charge which may accumulate on a workpiece during processing thereof. The discharge path (such as a circuit ground path) is generally coplanar with the top dielectric clamp surface and therefore does not impede efficient thermal contact between the clamp and the workpiece. In addition, the ground path is integrated with the dielectric clamp surface and therefore may mitigate the generation of particulate contaminates due to the frictional interface between the clamp and the workpiece.

According to one exemplary aspect of the present invention, the electrostatic clamp has a dielectric layer which overlies an electrode. A top surface of the dielectric layer interfaces with a workpiece during clamping thereof. A grounded portion is formed in the top surface of the dielectric layer via, for example, ion implantation. For example, with a polyimide type dielectric layer, selective ion implantation thereof causes chemical bonds to break or the chemical structure to be otherwise altered, thereby leading to an electrically conductive region thereat. Due to the ion implantation, the electrically conductive portion, which may be grounded, is generally coplanar with the top surface of the dielectric layer and thus does not impede effective thermal contact between the electrostatic clamp and the workpiece. When coupled to a circuit ground potential, the electrically conductive portion provides a path by which charge which accumulates on the workpiece during processing is removed in a controlled manner. Alternatively, any type of electrically insulating material may be utilized as the dielectric layer and the electrically conductive region may be formed via implantation of conductive species, as may be desired.

Figure 6:
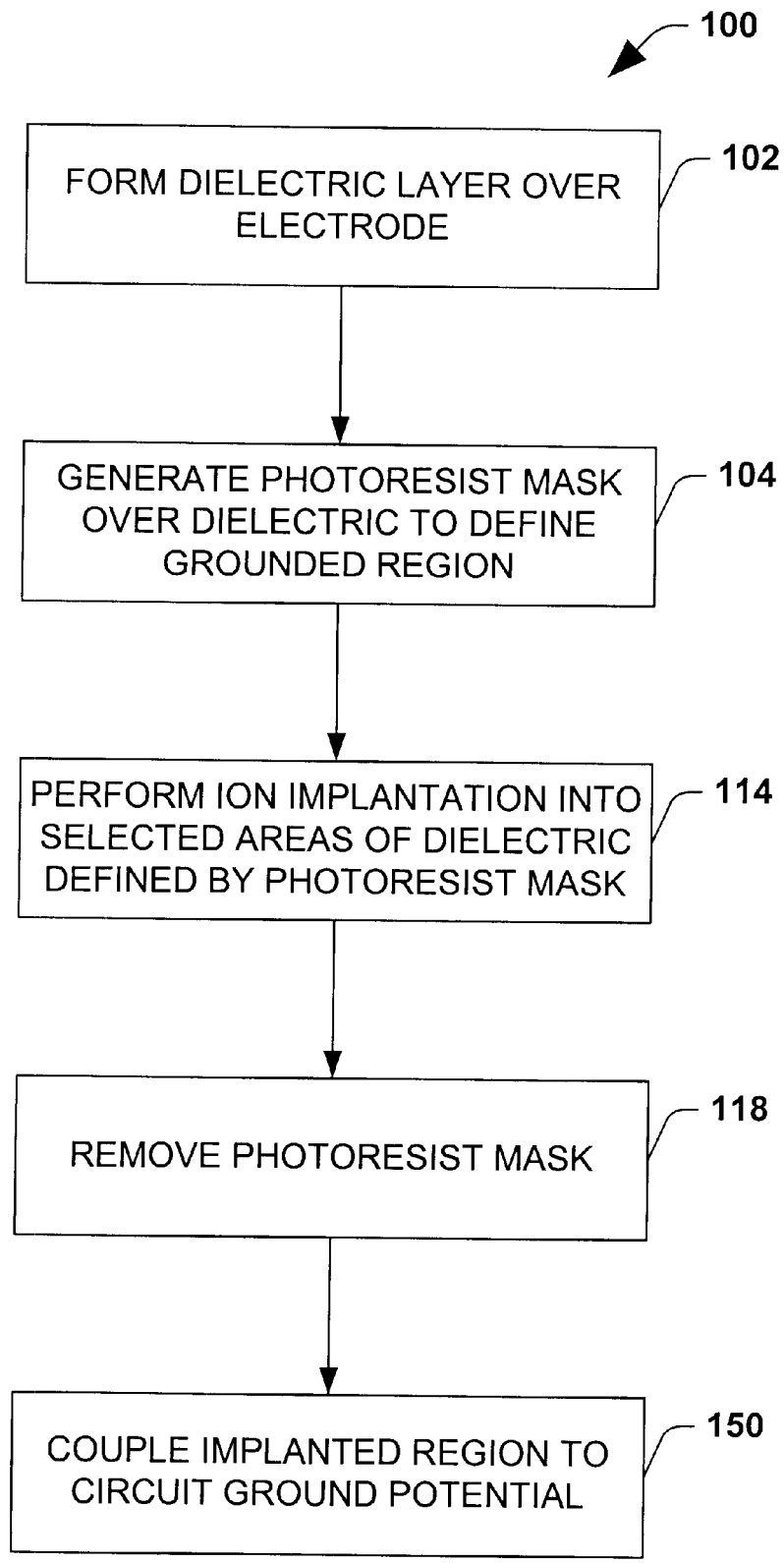
FIG. 6 is a flow chart diagram illustrating a method of forming an electrostatic clamp device according to the present invention.

Turning now to the figures, FIG. 6 is a flow chart diagram illustrating a method 100 of forming an electrostatic clamp or chuck according to the present invention. The method 100 begins at step 102, wherein a dielectric layer is formed over an electrode. For example, a conductive electrode coupled to an electric potential such as a power supply has a dielectric layer or structure placed thereon. The dielectric may comprise a dielectric sleeve which may be pulled over the electrode or may comprise a layer that is deposited on the electrode via, for example, chemical vapor deposition (CVD). The manner in which the dielectric is formed over the electrode may vary based on the type of dielectric employed and any manner of forming or placing the dielectric over the electrode is contemplated as falling within the scope of the present invention.

According to one exemplary aspect of the present invention, the dielectric layer may comprise any type of electrically insulating material, for example, a plastic, a ceramic or a glass material, respectively. As discussed above, depending on the type of dielectric material employed, the manner in which the dielectric is formed or otherwise placed over the electrically conducting electrode may vary. According to one aspect of the invention, the dielectric layer may comprise a polyimide such as KAPTON since such a material exhibits favorable properties such as a dielectric constant of about four (4) and a relatively high breakdown voltage characteristic which prevents the material from experiencing breakdown when a voltage is applied thereacross via the electrode during electrostatic clamp operation.

Figure 7:
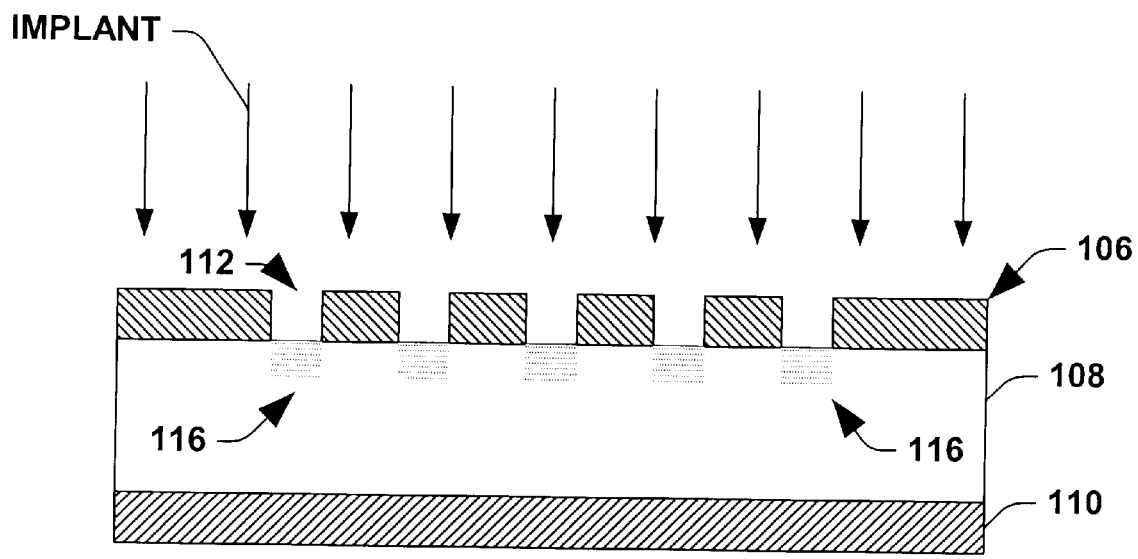
FIGS. 7 and 8 are cross section diagrams illustrating a method of generating a mask and forming doped regions via ion implantation according to one aspect of the present invention.

The method 100 continues at step 104, wherein a photoresist type mask is formed over the dielectric to define a region thereon which will subsequently comprise a grounded region. For example, as illustrated in FIG. 7, a photoresist mask 106 is formed over a dielectric layer 108 which itself overlies an electrode layer 110. According to one exemplary aspect of the invention, the photoresist mask 106 is formed and defined by depositing a photoresist material, for example, via spin coating, selectively exposing the photoresist to ultraviolet light through a photomask, and developing/removing the exposed regions. In the above manner, portions 112 of the photoresist are removed, thereby exposing corresponding portions of the underlying dielectric material.

Figure 8:
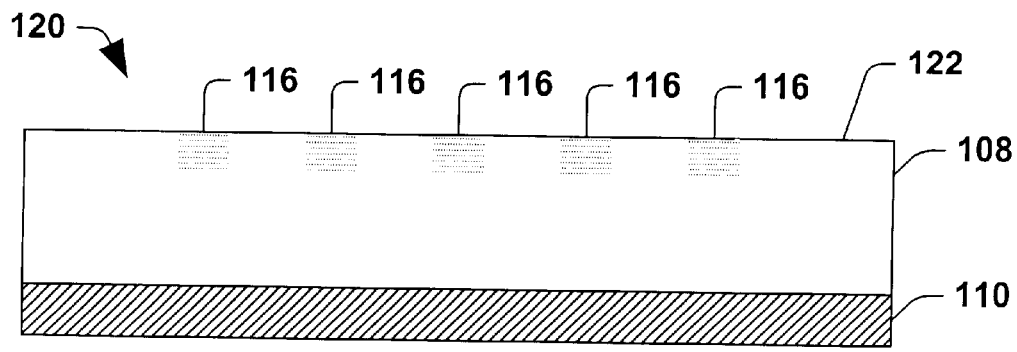

At step 114 of FIG. 6, the photoresist mask 106 and exposed portions 112 of the dielectric layer 108 are subjected to ion bombardment, for example, via ion implantation, as illustrated in FIG. 7. The ion implantation results in one or more regions 116 in the dielectric layer 108 becoming doped. The photoresist mask 106 is then removed at step 118, resulting in a structure, for example, as illustrated in FIG. 8 and designated at reference numeral 120. Note that the structure 120 of FIG. 8 has doped regions 116 that are within the dielectric layer 108 and are generally coplanar with a top surface 122 thereof. That is, the top surface 122 of the dielectric layer 108, which may form a top surface of the electrostatic clamp upon which a workpiece may be secured, is planar despite the presence of the doped regions 116 therein. Consequently, when a workpiece (not shown) is placed on the top surface of the clamp (e.g., corresponding to the top surface 122 of the dielectric layer 108) the presence of the doped regions 116 does not affect the engagement surface between the workpiece and the dielectric layer 108.

Accordingly, an effective thermal engagement is maintained, thereby promoting an efficient dissipation of heat away from the workpiece through the dielectric layer 108 during processing of the workpiece. Such an efficient thermal engagement is advantageous, for example, in serial ion implanters, wherein the implantation duty cycle associated with a workpiece may be significantly greater than in batch-type implanters, thereby resulting in significant heating thereof.

According to one aspect of the present invention, the doped regions 116 associated with the dielectric layer 108 are electrically conductive. For example, if the dielectric layer is a polyimide such as KAPTON, the ion implantation with a dopant species (e.g., Argon), alters a structure of the polyimide in the regions 116. Electrical conduction in conjugated polymers is ionic in nature and the charge transport is believed to be through the excitation of polarons (a radical cation that is partially delocalized over some polymer segment), bipolarons (a special dication from another independent polaron or from the first polaron level), and solitons (the bipolaron disassociated into two independent ground states).

Among several possible conduction mechanisms such as one-dimensional variable range hopping along the polymer chains or backbones, and three-dimensional hopping or percolation from one to another conducting islands, it is believed that the one-dimensional mechanism is the most dominant. In any event, it has been found that the electrical resistivity of polyimides decreases from an initial resistivity of about $10^{13}$ $\Omega$-cm to a resistivity of about $3\times10^{-3}$ $\Omega$-cm (which is a decrease of almost twenty orders of magnitude) after being subjected to ion implantation with Argon at a dose of about $2\times10^{17}/cm^2$ at an implantation energy of about 150 keV. The large increase in conductivity is believed to be due mainly to an increase in delocalized $\pi$-electrons from the unsaturated bonds and an increase of charge mobility enhanced by chain cross-linking. Therefore doped regions 116 exhibit substantial electrical conduction compared to the undoped dielectric region 108. Therefore it is believed that any form of dopant species that impacts the polyimide or other type polymer in the above manner may be employed to form the doped regions 116 and such dopant species are contemplated as falling within the scope of the present invention.

According to another aspect of the present invention, step 114 may be performed with other types of dielectric layer materials and various dopant species to form electrically conductive regions. For example, any type of dielectric material may be implanted with a dopant species that is electrically conductive in nature, and such implantation causes the doped region to be electrically conductive due to the type of dopant rather than due to the breakage or alteration of chemical bonds in the dielectric due to the bombardment thereof as discussed earlier in conjunction with a polyimide dielectric. For example, a dielectric layer such as a ceramic material may be selectively doped with aluminum or another metal or conductive material to form electrically conductive doped regions such as the regions 116 of FIG. 8, wherein the regions 116 are generally coplanar with the top surface 116 of the dielectric. Alternatively, semiconductor materials such as boron or phosphorous may also be employed as dopant species to form electrically conductive regions when appropriate doping parameters such as dose and duration are controlled, as may be appreciated.

Figure 3:
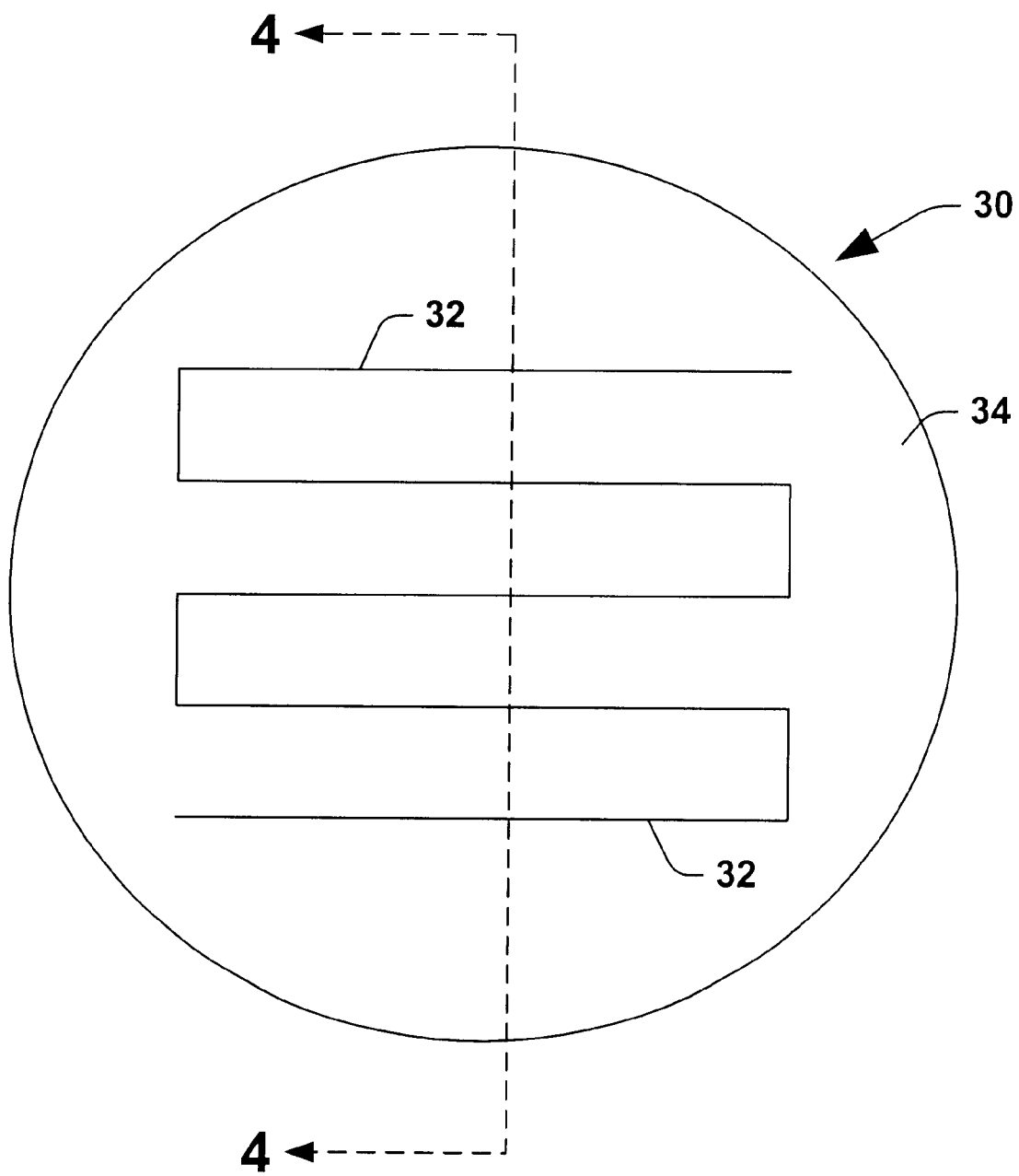
FIG. 3 is a prior art plan view illustrating a top surface portion of an electrostatic clamp, wherein a grounded conductor is formed over a dielectric layer of the clamp.
Figure 4:
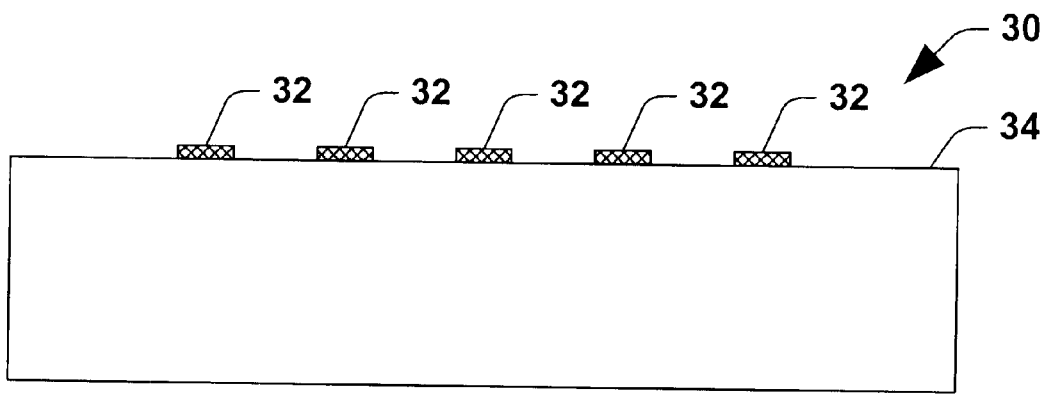
FIG. 4 is a prior art cross section view illustrating the electrostatic clamp of FIG. 3 taken along dotted line 4—4, wherein the grounded conductor is raised above a top surface portion of the dielectric layer.
Figure 5:
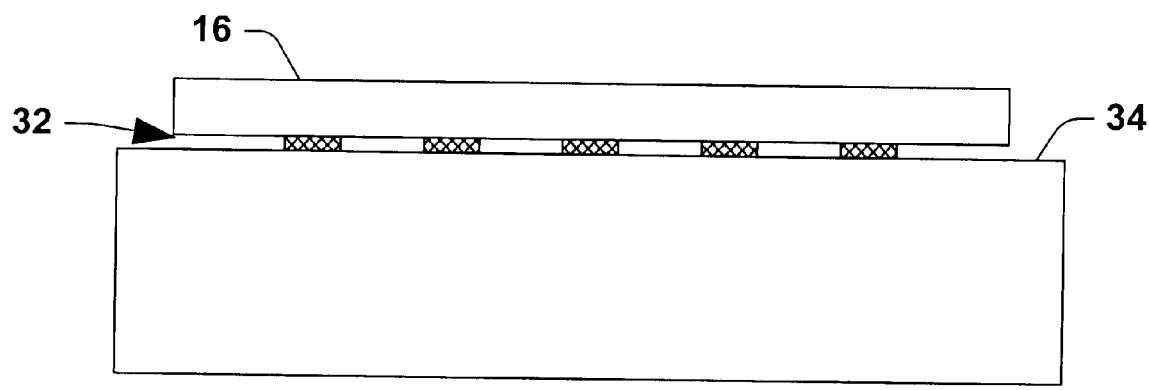
FIG. 5 is a prior art cross section view illustrating the electrostatic clamp of FIG. 3 taken along dotted line 4—4, wherein a workpiece overlies the top surface portion thereof, and wherein the workpiece is raised above the dielectric layer due to the raised grounded conductor thereon.

Note that in FIGS. 7 and 8, the doped regions 116 are formed in the dielectric layer 108 to form an electrically conductive region having a shape that mimics the serpentine shaped conductor 32 of prior art FIG. 3. It should be understood, however, that the doped region(s) 116 may take on various shapes, for example, by employing various types of photomasks to define the photoresist mask. Alternatively, if other types of masks are employed, by defining the shapes of such masks, various doped region shapes may be defined, as may be desired.

Figure 9:
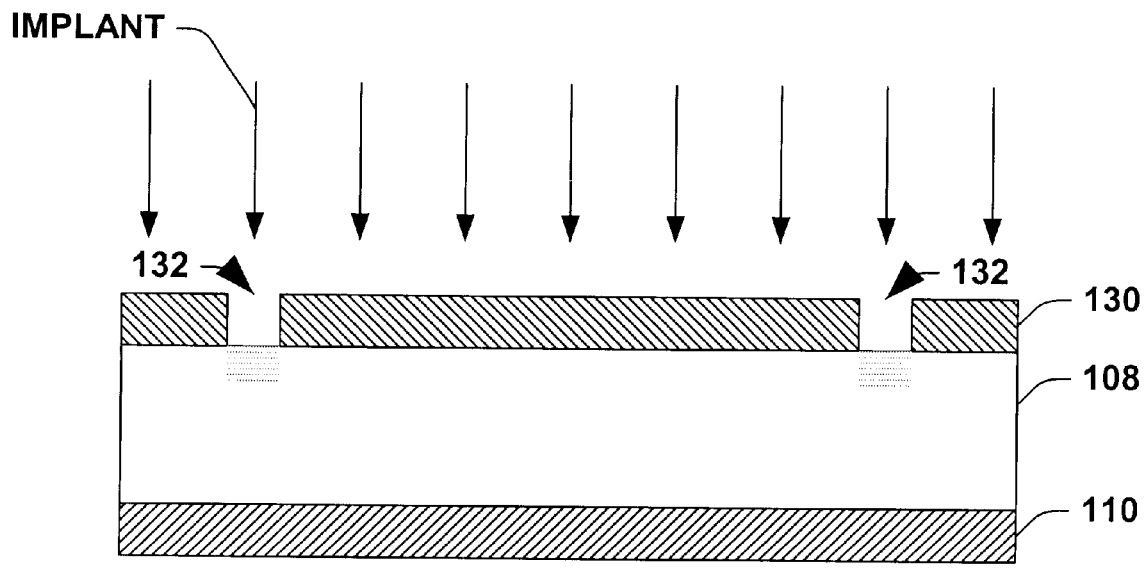
FIGS. 9 and 10 are cross section diagrams illustrating a method of generating a mask and forming doped regions via ion implantation according to another aspect of the present invention.
Figure 10:
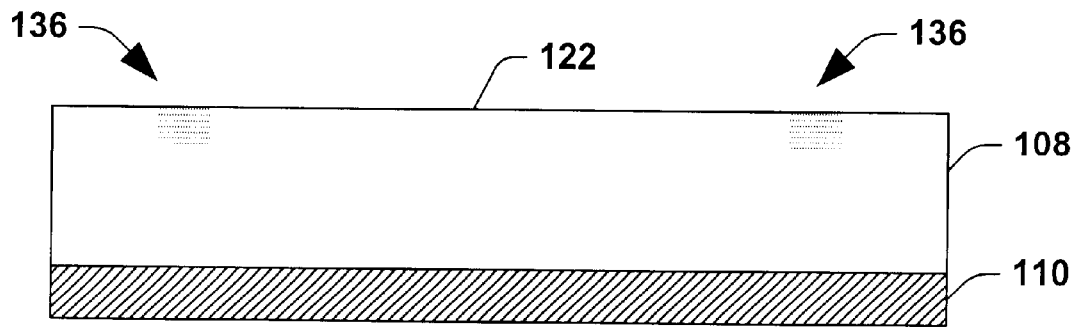
Figure 11:
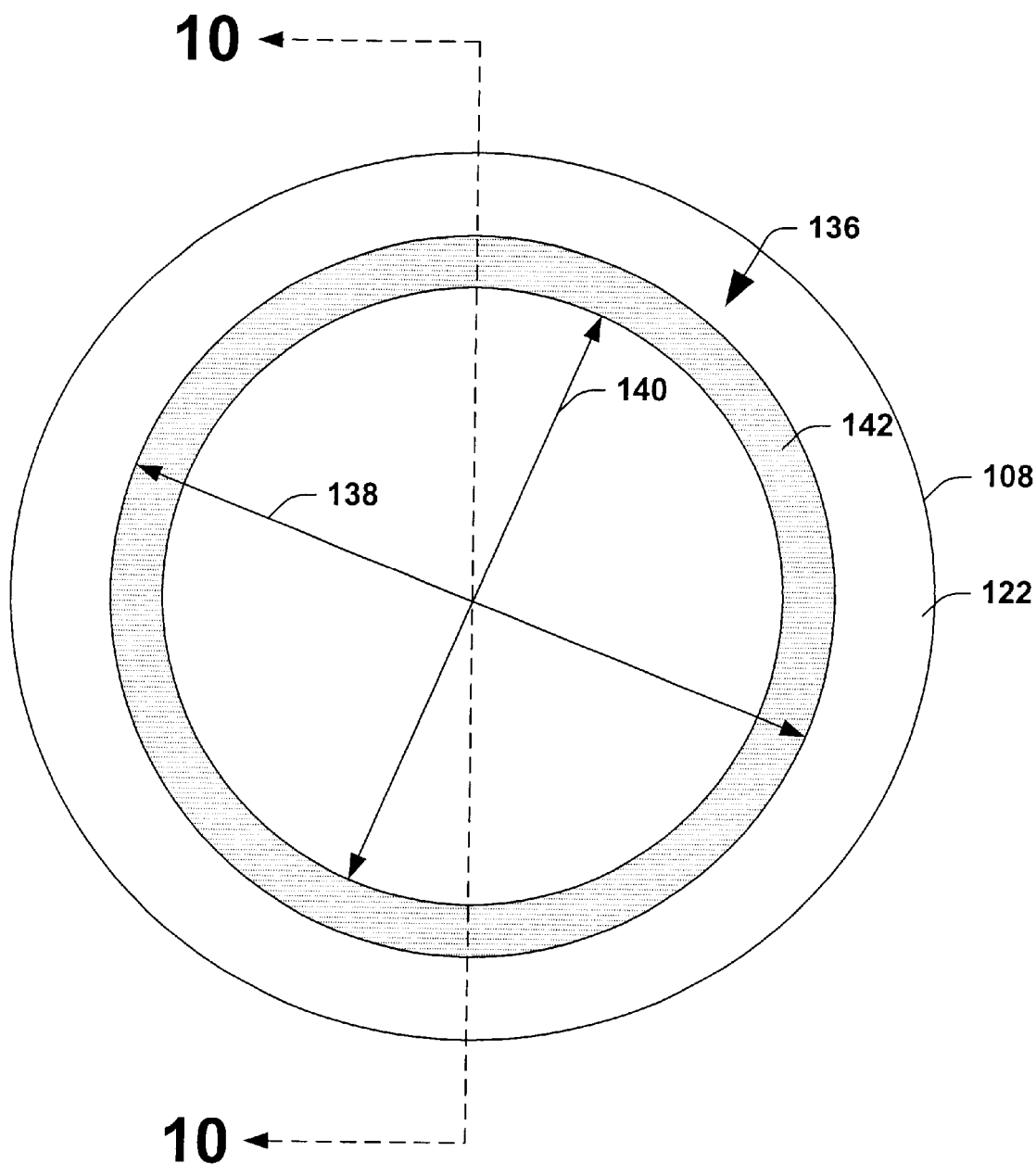
FIG. 11 is a plan view of an electrostatic clamp having an O-ring shaped doped region associated with a top surface of a dielectric layer according to the present invention.

One alternative exemplary shape for the doped region 116 is illustrated in FIGS. 9–11. In FIG. 9, for example, a photoresist mask 130 is defined having a concentric O-ring portion 132 that is removed to expose a portion of the dielectric 108 underneath. Consequently, an implantation causes a concentric O-ring type doped region 136 to be formed, as illustrated in FIGS. 10 and 11.

The concentric ring 136 of FIG. 11 has an outer diameter 138 that, in one aspect of the present invention, is less than a diameter of a workpiece (not shown) situated thereon. Accordingly, the electrically conductive doped region 136 will contact a portion of the workpiece and when the region 136 is grounded, for example, serves as a discharge path for any charge which may accumulate on the workpiece during processing. An inner diameter 140 of the region 136 may vary in addition to an outer diameter 138, as desired, thus allowing an area 142 associated with the region 136 to vary. The area 142 preferably is large enough to adequately discharge the accumulated charge, but sufficiently small to not interfere substantially with the electrostatic clamping force exerted by the underlying electrode 110 on the workpiece, so as not to interfere with the clamping function of the clamp or chuck. Note, however, the area 142 may vary greatly and such variations are contemplated as falling within the scope of the present invention. In addition, the shape of the region 136 may be further varied to minimize a distance in which charge must travel to reach a grounded portion, as may be appreciated. For example, the concentric O-ring 136 may include a cross-shaped structure within the ring, as may be desired. Such variations in the shape of the doped region 136 are also contemplated by the present invention.

Returning now to FIG. 6, the method 100 continues at step 150, wherein the implanted region which is electrically conductive is coupled to a discharge potential such as a circuit ground potential. In such a manner, the electrically conductive doped region(s) will also be at the discharge potential and thus provide the discharge path for the accumulated charge, to thereby remove such charge in a controlled manner. Any manner of coupling the doped regions to a discharge potential such as ground may be employed and is contemplated as falling within the scope of the present invention.

Figure 12:
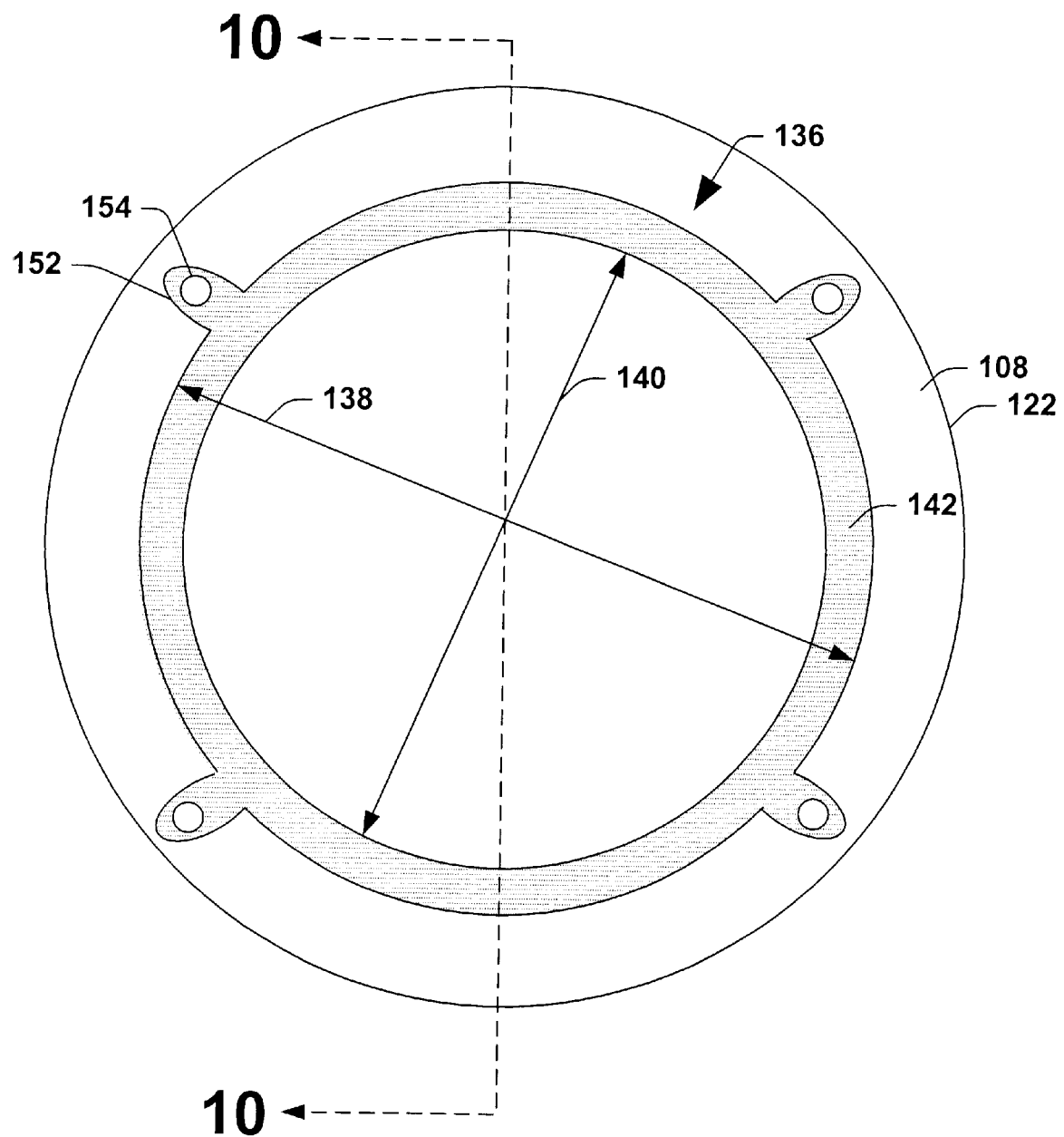
FIG. 12 is a plan view of an electrostatic clamp having an O-ring shaped doped region with tabs associated therewith for facilitating coupling the doped region to a discharge potential such as circuit ground according to the present invention.

According to one exemplary aspect of the present invention, step 150 may be accomplished by forming the doped region 136 with tab regions 152 associated therewith, as illustrated in FIG. 12. The one or more tab regions 152 are shaped to define a hole portion 154 therein which may correspond to a hole in the dielectric layer that extends down to a portion of the clamp that is held at a discharge potential such as circuit ground. Therefore a screw (not shown) or other type elongate electrically conductive member may engage the hole portion 154 and extend between the discharge potential and the tab portion 152 to thereby electrically couple the doped region 136 to the discharge potential. These and other mechanisms for coupling the doped region 136 associated with the dielectric layer 108 may be employed and are contemplated as falling within the scope of the present invention.

Although the invention has been shown and described with respect to a certain embodiments, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An electrostatic clamp, comprising:
    a dielectric layer overlying an electrode; and
    a doped region in the dielectric layer, wherein the doped region is electrically conductive, and the doped region is coupled to a circuit ground potential and is operable to bleed off charge which accumulates on a workpiece residing on the dielectric layer during processing.

2. The electrostatic clamp of claim 1, wherein the dielectric layer comprises a polyimide.

3. The electrostatic clamp of claim 2, wherein the polyimide comprises Kapton.

4. The electrostatic clamp of claim 2, wherein the doped region comprises portions of the polyimide that have experienced bond breakage due to dopant implantation, and wherein the portions having bond breakage associated therewith are electrically conductive.

5. The electrostatic clamp of claim 1, wherein the dielectric layer comprises a ceramic, a plastic or a glass material.

6. The electrostatic clamp of claim 5, wherein the doped region comprises portions of the ceramic, plastic or glass material that have been bombarded with an electrically conductive dopant material, thereby making the portions of the ceramic, plastic or glass material electrically conductive.

7. An electrostatic clamp, comprising:
    a dielectric layer overlying an electrode; and
    a doped region in the dielectric layer, wherein the doped region is electrically conductive, and wherein when the doped region is coupled to a circuit ground potential, the doped region is operable to bleed off charge which accumulates on a workpiece residing on the dielectric layer during processing, wherein the doped region further comprises a tab region defining a hole therein, and wherein the electrostatic clamp further comprises an electrically grounded region underlying the dielectric layer, and an electrically conductive member extending through the hole defined by the tab region down to the electrically grounded region, thereby making the doped region electrically grounded.

8. An ion implantation workpiece support system, comprising:
    a workpiece support component; and
    an electrostatic clamp associated with the workpiece support component, and operable to secure a workpiece to the workpiece support component via an electrostatic force, wherein the electrostatic clamp comprises:
        an electrode operable to receive a voltage potential applied thereto;
        an electrically insulative material overlying the electrode and having a surface opposite the electrode for supporting a workpiece thereon; and
        an electrically conductive region embedded in the electrically insulating material and generally coplanar with the surface for supporting the workpiece, wherein the electrically conductive region is coupled to a circuit ground potential and operable to bleed off charge which accumulates on the workpiece during implantation thereof.

9. The ion implantation workpiece support system of claim 8, further comprising a power supply operatively coupled to the electrode and operative to supply a voltage potential thereto.

10. The ion implantation system of claim 8, wherein the electrically insulating material comprises a plastic, a ceramic or a glass.

11. The ion implantation system of claim 10, wherein the material comprises a polyimide.

12. The ion implantation system of claim 11, wherein the electrically conductive region embedded in the polyimide comprises broken polyimide bonds.

13. The ion implantation system of claim 10, wherein the electrically conductive region embedded in the electrically insulating material comprises an electrically conductive dopant implanted therein.

14. The ion implantation system of claim 8, wherein the surface of the electrically insulating material having the electrically conductive region embedded therein is generally planar, thereby making thermal contact with a substantial portion of the workpiece, thereby facilitating transfer of heat away from the workpiece via the electrically insulating material during implantation thereof.

15. The ion implantation system of claim 8, wherein the electrically conductive region comprises a generally O-ring shaped region having an outer diameter associated therewith which is less than a diameter of the workpiece.

16. The ion implantation system of claim 15, wherein the generally O-shaped region occupies a fractional area of the surface of the electrically insulating material less than about 0.5.

17. A method of forming an electrostatic clamp, comprising the steps of:
    forming an electrically insulating layer over an electrode; and
    doping a portion of the electrically insulating layer, wherein the doped portion of the electrically insulating layer becomes electrically conductive, wherein doping the portion of the electrically insulating layer comprises:
        depositing a photoresist layer over the electrically insulating material;
        selectively exposing the photoresist layer;
        developing the selectively exposed photoresist layer, thereby removing a portion thereof corresponding to the portion of the electrically insulating layer to be doped; and
        bombarding the exposed portion of the electrically insulating layer with a dopant material.

18. The method of claim 17, wherein the electrically insulating layer comprises a plastic material, a ceramic material or a glass material.

19. The method of claim 17, wherein the electrically insulating material comprises a polyimide, and wherein doping the portion thereof comprises breaking polyimide chemical bonds at the portions, and wherein the broken bonds result in the polyimide portions being electrically conductive.

20. The method of claim 17, wherein the dopant material comprises an electrically conductive material.

21. The method of claim 17, wherein the electrically insulating material comprises a polyimide, and the step of bombarding the exposed portion of the electrically insulating layer comprises implanting the exposed portion with Argon ions with a dose of about $2\times10^{17}$ ions/cm$^2$ and an implantation energy of about 150 keV, thereby resulting in the doped portion of the polyimide exhibiting a resistivity of about $3\times10^{-5}$ Ω-cm.

22. The method of claim 17, wherein the doped portion forms a generally O-ring shaped structure having an outer diameter associated therewith which is less than a diameter of a workpiece to be processed on the electrostatic clamp.

* * * * *